(12) United States Patent
Kuramasu

(10) Patent No.: US 9,479,172 B2
(45) Date of Patent: Oct. 25, 2016

(54) DIFFERENTIAL OUTPUT BUFFER

(71) Applicant: MegaChips Corporation, Osaka (JP)

(72) Inventor: Tomoaki Kuramasu, Chiba (JP)

(73) Assignee: MegaChips Corporation, Osaka (JP)

(*) Notice: Subject to any disclaimer, the term of this patent is extended or adjusted under 35 U.S.C. 154(b) by 0 days.

(21) Appl. No.: 15/002,513

(22) Filed: Jan. 21, 2016

(65) Prior Publication Data

US 2016/0218715 A1    Jul. 28, 2016

(30) Foreign Application Priority Data

Jan. 22, 2015    (JP) ................. 2015-010147

(51) Int. Cl.
| H03B 1/00 | (2006.01) |
| H03K 3/00 | (2006.01) |
| H03K 19/0185 | (2006.01) |

(52) U.S. Cl.
CPC ............. H03K 19/018514 (2013.01)

(58) Field of Classification Search
CPC ............. H03H 11/28; H03K 17/687; H03K 19/017509
USPC ................ 327/108–112, 427, 434, 437, 355; 326/82, 83, 87, 30, 115; 375/259, 295
See application file for complete search history.

(56) References Cited

U.S. PATENT DOCUMENTS

| 5,859,558 A | 1/1999 | Chen et al. | |
| 6,559,692 B2* | 5/2003 | Kimball | H04L 7/0331 326/86 |
| 8,786,321 B2* | 7/2014 | Gupta | H04L 25/0272 327/108 |
| 2002/0050845 A1* | 5/2002 | Popescu | H03F 1/22 327/108 |
| 2006/0017468 A1 | 1/2006 | Azadet et al. | |
| 2009/0206886 A1* | 8/2009 | Chang | H04L 25/028 327/108 |
| 2010/0073037 A1* | 3/2010 | Kumath | H03K 19/00384 327/108 |
| 2011/0241736 A1* | 10/2011 | Lee | H03K 5/082 327/108 |

FOREIGN PATENT DOCUMENTS

| JP | H11-41085 A | 2/1999 |
| JP | H11-513235 A | 11/1999 |
| JP | 2006-042349 A | 2/2006 |
| JP | 2009-225205 A | 10/2009 |
| JP | 2010-098590 A | 4/2010 |

\* cited by examiner

*Primary Examiner* — Lincoln Donovan
*Assistant Examiner* — Thomas Skibinksi
(74) *Attorney, Agent, or Firm* — Osha Liang LLP

(57) ABSTRACT

The differential output buffer comprises the differential output circuit, and the bias voltage generation circuit that is the replica circuit of the differential output circuit. The bias voltage generation circuit generates, by the operational amplifier, the bias voltage for controlling currents respectively flowing in the first current source of the differential output buffer and the second current source of the bias voltage generation circuit such that the voltage of the third internal node between the third internal and external resistors and the third switch of the bias voltage generation circuit becomes equal to the reference voltage equal to the voltage of the first internal node when the first switch of the differential output buffer is in an ON state or equal to the voltage of the second internal node when the second switch of the differential output buffer is in an ON state.

8 Claims, 4 Drawing Sheets

DIFFERENTIAL OUTPUT BUFFER

CROSS-REFERENCE TO RELATED APPLICATIONS

The present application claims priority under 35 U.S.C. §119 to Japanese Patent Application No. 2015-10147, filed on Jan. 22, 2015. The above application is hereby expressly incorporated by reference, in its entirety, into the present application.

BACKGROUND OF THE INVENTION

The present invention relates to a differential output buffer composed of a current mode logic (CML) circuit.

FIG. 3 is a circuit diagram illustrating an example of a configuration of a conventional differential output buffer. A differential output buffer 30 illustrated in FIG. 3 is provided with a differential output circuit 12, and a bias voltage generation circuit 34 that generates a bias voltage for controlling a current flowing in the differential output circuit 12.

The differential output circuit 12 is a CML circuit that outputs a differential output signal corresponding to a differential input signal, and is provided with a first switch 16a and a second switch 16b, a first internal resistor 18a and a second internal resistor 18b, a first current source 20a, a first external capacitor 22a and a second external capacitor 22b, and a first external resistor 24a and a second external resistor 24b.

FIG. 3 illustrates the case in which a high voltage and a low voltage are input as the differential input signal to a gate of an NMOS (N-type MOS transistor) constituting the first switch 16a and a gate of an NMOS constituting the second switch 16b, respectively, and thus, the first switch 16a is in an ON state, and the second switch 16b is in an OFF state.

The differential output signal of the differential output circuit 12 is output from a first internal node between the first internal resistor 18a and the first switch 16a, and a second internal node between the second internal resistor 18b and the second switch 16b.

The bias voltage generation circuit 34 is provided with a second current source 36, and a constant current generation circuit 38. An NMOS constituting the second current source 36 is configured with an NMOS having a size of "1/a" times the size of the first current source 20a ("a" is a positive real number other than zero).

Next, an operation of the differential output buffer 30 will be described.

Here, the resistance values of the first internal resistor 18a and the second internal resistor 18b are each represented as $R_{INT}$, the resistance values of the first external resistor 24a and the second external resistor 24b are each represented as $R_{EXT}$, the currents flowing in the first internal resistor 18a and the second internal resistor 18b are respectively represented as $I_A$ and $I_B$, the voltages of the first internal node and the second internal node are respectively represented as $V_A$ and $V_B$, and currents flowing through the first current source 20a and the second current source 36 are respectively represented as $I_{TOTAL}$ and $I_{SOURCE}$.

As illustrated in FIG. 3, when a high voltage and a low voltage are respectively input as the differential input signal to the gate of the NMOS of the first switch 16a and the gate of the NMOS of the second switch 16b, the first switch 16a of the differential output circuit 12 is in an ON state and the second switch 16b thereof is in an OFF state.

In this case, the current $I_A$ flows from a high voltage power supply through the first internal resistor 18a while the current $I_B$ flows from the high voltage power supply through the second internal resistor 18b, the second external capacitor 22b, the second external resistor 24b, the first external resistor 24a, and the first external capacitor 22a, and the current $I_{TOTAL}$ that is a sum of the two currents flows to a low voltage power supply through the first switch 16a and the first current source 20a. As a result, the differential output signal with the first internal node at a low voltage and the second internal node at a high voltage is output.

In the bias voltage generation circuit 34, the constant current $I_{SOURCE}$ supplied from the constant current generation circuit 38 flows to a low voltage power supply through the second current source 36. Since the NMOS of the first current source 20a and the NMOS of the second current source 36 constitute a current mirror circuit, the current $I_{TOTAL}$ that has a volume of "a" times the volume of the current $I_{SOURCE}$ flowing through the second current source 36 flows through the first current source 20a.

The voltage $V_A$ and the voltage $V_B$, that is, differential amplitude $V_{OD}=V_A-V_B$ is determined according to the current value of the current $I_{TOTAL}$, the resistance value $R_{INT}$, and the resistance value $R_{EXT}$.

Here, in the conventional differential output buffer 30, there is a problem in that the differential amplitude $V_A-V_B$ varies. The causes of occurrence of the variation in the differential amplitude $V_A-V_B$ are the following factors of (1) and (2):

(1) Mismatch of a source-drain voltage $V_{DS}$ between the NMOS of the first current source 20a and the NMOS of the second current source 36, which constitute the current mirror circuit; and (2) Variation in the resistance value $R_{INT}$ of the first internal resistor 18a and the second internal resistor 18b.

Regarding (1), if the channel length (L length) of the transistor is increased in order to reduce the influence of the mismatch of the voltage $V_{DS}$, the variation in the current $I_{TOTAL}$, that is, the variation in the differential amplitude $V_A-V_B$ can be decreased to some extent, but the size increases.

Regarding (2), since the current $I_{SOURCE}$ flowing through the second current source 36 of the mirror source of the current mirror circuit is generated by the on-resistance of the NMOS of the second current source 36, the current increases or decreases, for example, according to the variation in the resistance value $R_{INT}$ of the first internal resistor 18a and the second internal resistor 18b formed on a semiconductor chip, and thus the differential amplitude $V_A-V_B$ varies. Meanwhile, the resistance value $R_{EXT}$ of the first external resistor 24a and the second external resistor 24b connected to the outside of the semiconductor chip hardly varies, which does not accord with the variation in the resistance value $R_{INT}$ of the first internal resistor 18a and the second internal resistor 18b.

Then, the degree of influence of the variation in the resistance value $R_{INT}$ of the first internal resistor 18a and the second internal resistor 18b on the differential amplitude $V_A-V_B$ of the differential output signal is calculated as follows.

Since the current $I_{TOTAL}$ is a sum of the current $I_A$ and the current $I_B$, the current $I_{TOTAL}$ is expressed by Equation (1).

$$I_{TOTAL}=I_A+I_B \quad \text{Equation (1)}$$

The current values of the current $I_A$ and the current $I_B$ are expressed by Equations (2) and (3).

$$I_A = \frac{R_{INT} + 2R_{EXT}}{2R_{INT} + 2R_{EXT}} \cdot I_{TOTAL} \qquad \text{Equation (2)}$$

$$I_B = \frac{R_{INT}}{2R_{INT} + 2R_{EXT}} \cdot I_{TOTAL} \qquad \text{Equation (3)}$$

Since the voltage $V_A$ and the voltage $V_B$ are calculated with a product of the current value and the resistance value, the voltage $V_A$ and the voltage $V_B$ are expressed by Equations (4) and (5) obtained by using Equations (2) and (3).

$$V_A = I_A * R_{INT} = \frac{R_{INT} + 2R_{EXT}}{2R_{INT} + 2R_{EXT}} \cdot I_{TOTAL} \cdot R_{INT} \qquad \text{Equation (4)}$$

$$V_B = I_B * R_{INT} = \frac{R_{INT}}{2R_{INT} + 2R_{EXT}} \cdot I_{TOTAL} \cdot R_{INT} \qquad \text{Equation (5)}$$

The differential amplitude $V_A - V_B$ is calculated using Equation (6) from Equations (4) and (5).

$$V_A - V_B = \frac{I_{TOTAL} \cdot R_{INT} \cdot R_{EXT}}{R_{INT} + R_{EXT}} \qquad \text{Equation (6)}$$

Thus, in the conventional differential output buffer 30, the terms of the current $I_{TOTAL}$, the resistance value $R_{INT}$ of the first internal resistor 18a and the second internal resistor 18b, and the resistance value $R_{EXT}$ of the first external resistor 24a and the second external resistor 24b are included in the equation of the differential amplitude $V_A - V_B$. Therefore, it can be seen that the differential amplitude $V_A - V_B$ varies according to the variation in the current $I_{TOTAL}$, that is, the voltage $V_{DS}$, and also varies according to the variation in the resistance value $R_{INT}$.

FIG. 4 is an exemplary eye diagram illustrating the differential amplitude $V_A - V_B$ of the differential output buffer illustrated in FIG. 3. The vertical axis of the eye diagram illustrated in FIG. 4 indicates voltage V (mV), and the horizontal axis indicates time. This eye diagram is for the case in which it is assumed that the resistance value $R_{INT}$ has a variation of ±20% due to a variation in a process. The solid line indicates the case in which there is a variation of −20%, the dashed line indicates the case in which there is no variation, and the long dashed short dashed line indicates the case in which there is a variation of +20%. As shown in this eye diagram, it can be confirmed that, in the conventional differential output buffer 30, the differential amplitude $V_A - V_B$ greatly varies according to the variation in the resistance value $R_{INT}$.

Here, prior art documents relevant to the present invention include JP 11-513235 A relating to an analog front-end circuit that converts an input voltage to a differential current, JP 2010-98590 A relating to a differential output buffer that receives an input differential signal, and generates and outputs an output differential signal having a desired center voltage and desired amplitude, JP 11-41085 A relating to an output buffer circuit that complementarily outputs data, JP 2009-225205 A relating to a CML circuit that can suppress a variation in characteristics caused by a variation in a manufacturing process, JP 2006-42349 A relating to a signal level in a current mode logic circuit, and the like.

SUMMARY OF THE INVENTION

An object of the present invention is to solve the aforementioned problems in the prior art and provide a differential output buffer capable of reducing the variation in the differential amplitude of the differential output signal.

In order to achieve the above object, the present invention provides a differential output buffer comprising a differential output circuit, and a bias voltage generation circuit that generates a bias voltage for controlling a current flowing in the differential output circuit, wherein the differential output circuit includes:

a first switch and a second switch, one of the first switch and the second switch being in an ON state and another thereof being in an OFF state according to a differential input signal;

a first internal resistor and a second internal resistor which are connected between a high voltage power supply and the first switch and between the high voltage power supply and the second switch, respectively, and have a same resistance value;

a first current source which is connected between the first and second switches and a low voltage power supply, and passes a current having a fixed value according to the bias voltage; and a first external resistor and a second external resistor which are connected in series between a first internal node and a second internal node, and have a same resistance value, the first internal node being located between the first internal resistor and the first switch, and the second internal node being located between the second internal resistor and the second switch, and the bias voltage generation circuit includes:

a third switch equivalent to the first switch or the second switch in an ON state;

a third internal resistor which is connected between the high voltage power supply and the third switch, and is equivalent to the first internal resistor or the second internal resistor;

a second current source which is connected between the third switch and the low voltage power supply, and is equivalent to the first current source;

a third external resistor which is connected between the high voltage power supply and the third switch in parallel to the third internal resistor, and is equivalent to the first external resistor or the second external resistor; and an operational amplifier that generates the bias voltage for controlling currents respectively flowing in the first current source and the second current source such that a voltage of a third internal node, which is equivalent to the first internal node or the second internal node, and is between the third internal and external resistors and the third switch becomes equal to a reference voltage equal to a voltage of the first internal node when the first switch is in an ON state or equal to a voltage of the second internal node when the second switch is in an ON state.

According to the present invention, it is possible to eliminate a current error due to a difference in the source-drain voltage $V_{DS}$ between the MOS transistor of the second current source and the MOS transistor of the first current source by performing control such that the voltage of the third internal node is equal to the reference voltage, and to reduce the variation in the differential amplitude of the differential output signal.

Further, according to the present invention, it is possible to determine the differential amplitude by the reference voltage, regardless of the resistance value of the first internal resistor and the second internal resistor.

DETAILED DESCRIPTION OF THE INVENTION

Hereinafter, a differential output buffer of the present invention will be described based on a preferred embodiment illustrated in the accompanying drawings.

Figure 1:
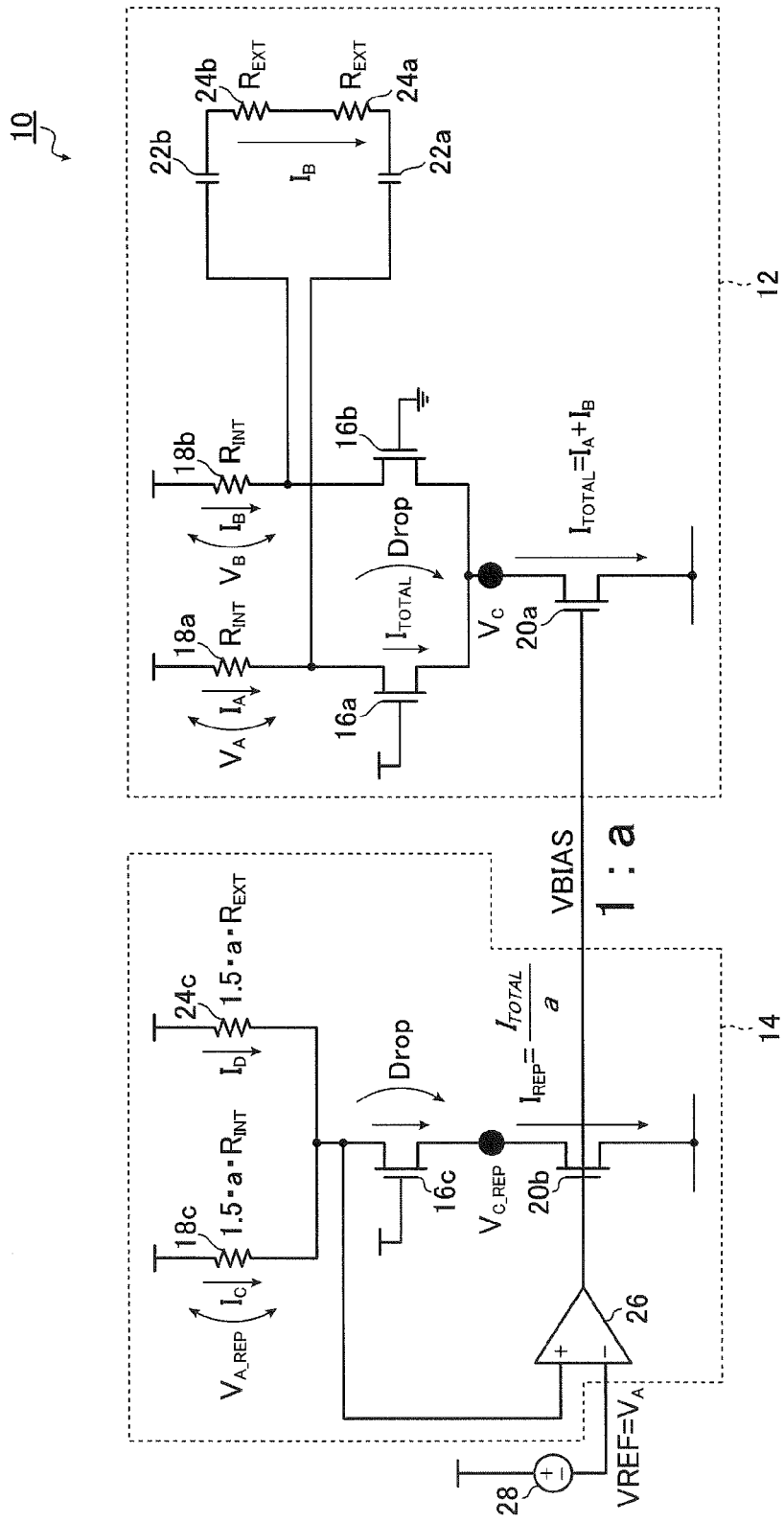
FIG. 1 is a circuit diagram illustrating a configuration of a differential output buffer in an embodiment of the present invention.

FIG. 1 is a circuit diagram of an embodiment illustrating a configuration of a differential output buffer of the present invention. A differential output buffer 10 illustrated in FIG. 1 is provided with a differential output circuit 12, and a bias voltage generation circuit 14 that generates a bias voltage VBIAS for controlling a current flowing in the differential output circuit 12.

The differential output buffer 10 is configured such that a ratio (current ratio) of a total current $I_{REF}$ flowing through the bias voltage generation circuit 14 and a total current $I_{TOTAL}$ flowing through the differential output circuit 12 is "1:a" ("a" is a positive real number other than 0).

The differential output circuit 12 is a CML circuit that outputs a differential output signal corresponding to a differential input signal, and is provided with a first switch 16a and a second switch 16b, a first internal resistor 18a and a second internal resistor 18b, a first current source 20a, a first external capacitor 22a and a second external capacitor 22b, and a first external resistor 24a and a second external resistor 24b.

The first switch 16a and the second switch 16b are differential switches in which one of the first switch 16a and the second switch 16b is in an ON state and the other is in an OFF state according to the differential input signal, and are configured with NMOSs in this embodiment.

FIG. 1 illustrates the case in which a high voltage and a low voltage are input as the differential input signal to the gate of the NMOS of the first switch 16a and the gate of the NMOS of the second switch 16b, respectively, and thus, the first switch 16a is in an ON state, and the second switch 16b is in an OFF state.

Also in the case in which a low voltage and a high voltage are input as the differential input signal to the gate of the NMOS of the first switch 16a and the gate of the NMOS of the second switch 16b, respectively, the same operation as in this embodiment is performed.

The first internal resistor 18a and the second internal resistor 18b are internal termination resistors having the same resistance value RINT. In this embodiment, the first internal resistor 18a and the second internal resistor 18b are termination resistors of 50Ω. The first internal resistor 18a and the second internal resistor 18b are connected between a high voltage power supply that supplies the high voltage and the first switch 16a, and between the high voltage power supply and second switch 16b, respectively.

The differential output signal of the differential output circuit 12 is output from a first internal node between the first internal resistor 18a and the first switch 16a, and a second internal node between the second internal resistor 18b and the second switch 16b.

While each of the first internal resistor 18a and the second internal resistor 18b is normally configured with a polysilicon resistance or the like, each of the first internal resistor 18a and the second internal resistor 18b may also be configured with, for example, an on-resistance of a MOS transistor in an ON state.

The first current source 20a passes a current having a fixed value according to the bias voltage VBIAS generated by the bias voltage generation circuit 14. In the case of this embodiment, the first current source 20a is configured with an NMOS.

The NMOS of the first current source 20a is connected between the first and second switches 16a and 16b and a low voltage power supply that supplies a low voltage lower than the high voltage, and the bias voltage VBIAS is input to the gate of the NMOS of the first current source 20a.

The first external capacitor 22a and the second external capacitor 22b are capacitive elements having the same capacitance value, and the first external resistor 24a and the second external resistor 24b are termination resistors having the same resistance value $R_{EXT}$. In this embodiment, the first external resistor 24a and the second external resistor 24b are termination resistors of 50Ω. The first external capacitor 22a, the first external resistor 24a, the second external resistor 24b, and the second external capacitor 22b are connected in series in this order between the first internal node and the second internal node, that is, between signals of the differential output signal.

The first external capacitor 22a and the second external capacitor 22b are not essential components, and the first external resistor 24a and the second external resistor 24b may be connected in series in this order between the first internal node and the second internal node.

Next, the bias voltage generation circuit 14 is a replica circuit of the differential output circuit 12, and is provided with a third switch 16c, a third internal resistor 18c, a second current source 20b, a third external resistor 24c, and an operational amplifier 26.

The third switch 16c is equivalent to the first switch 16a or the second switch 16b in an ON state of the differential output circuit 12, and is configured with an NMOS having a size of "1/a" times the size of the first switch 16a or the second switch 16b.

The gate of the NMOS of the third switch 16c is connected to a high voltage power supply in accordance with the first switch 16a or the second switch 16b in an ON state. That is, the third switch 16c of this embodiment is equivalent to the first switch 16a in an ON state.

The third internal resistor 18c is equivalent to the first internal resistor 18a or the second internal resistor 18b of the differential output circuit 12, and is connected between the high voltage power supply and the third switch 16c.

The third internal resistor 18c has a resistance value $1.5 \cdot a \cdot R_{INT}$ that is "1.5·a" times the resistance value $R_{INT}$ of the first internal resistor 18a or the second internal resistor 18b.

The second current source 20b is equivalent to the first current source 20a of the differential output circuit 12, and is configured with an NMOS having a size of "1/a" times the size of the first current source 20a.

The NMOS of the second current source 20b is connected between the third switch 16c and a low voltage power supply, and the bias voltage VBIAS output from the operational amplifier 26 is input to the gate of the NMOS of the second current source 20b.

The third external resistor 24c is equivalent to the first external resistor 24a or the second external resistor 24b of the differential output circuit 12, and is connected between the high voltage power supply and the third switch 16c in parallel to the third internal resistor 18c.

The third external resistor 24c has a resistance value "1.5·a·$R_{EXT}$" that is "1.5·a" times the resistance value of the first external resistor 24a or the second external resistor 24b.

The resistance values of the third internal resistor 18c and the third external resistor 24c are values when the resistance value $R_{INT}$ of each of the first internal resistor 18a and the second internal resistor 18b is 50Ω, the resistance value $R_{EXT}$ of each of the first external resistor 24a and the second external resistor 24b is 50Ω, and a ratio of the total current $I_{REP}$ flowing through the bias voltage generation circuit 14 to the total current $I_{TOTAL}$ flowing through the differential output circuit 12 is "1:a", as in the case of a general CML circuit.

Meanwhile, even when the resistance value $R_{INT}$ and the resistance value $R_{EXT}$ differ from those of this embodiment, the differential output buffer 10 properly operates. In this case, the resistance values of the third internal resistor 18c and the third external resistor 24c are determined according to the resistance value $R_{INT}$ and the resistance value $R_{EXT}$. When the current ratio is "a=1", the multiplying factor "X" of the resistance values of the third internal resistor 18c and the third external resistor 24c with respect to the resistance value $R_{INT}$ and the resistance value $R_{EXT}$ can be calculated using Equation (8).

$$X = \frac{R_{INT} + 2R_{EXT}}{2R_{INT} + 2R_{EXT}}\left(1 + \frac{R_{INT}}{R_{EXT}}\right) \quad \text{Equation (8)}$$

When the resistance value $R_{INT}$=50Ω and the resistance value $R_{EXT}$=50Ω as defined in this embodiment are applied to Equation (8), the multiplying factor "X" is to be 1.5, and by this, it can be confirmed that Equation (8) is correct. Further, for example, when the resistance values $R_{INT}$ of the first internal resistor 18a and the second internal resistor 18b are each 50Ω and the resistance values $R_{EXT}$ of the first external resistor 24a and the second external resistor 24b are each 100Ω, the multiplying factor "X" is to be 1.25.

The operational amplifier 26 generates the bias voltage VBIAS for controlling the current $I_{TOTAL}$ and the current $I_{REP}$ respectively flowing in the first current source 20a and the second current source 20b such that a voltage of a third internal node, which is equivalent to the first internal node or the second internal node, between the third internal and external resistors 18c and 24c and the third switch 16c becomes equal to a reference voltage VREF supplied from a reference voltage generation circuit 28 such as an external bandgap reference (BGR) circuit.

The reference voltage VREF is input to the minus input terminal of the operational amplifier 26, and the voltage of the third internal node is input to the plus input terminal thereof. In this embodiment, the voltage $V_A$ of the first internal node in the ON state is input as the reference voltage VREF. The bias voltage VBIAS output from the operational amplifier 26 is input to the gates of the NMOSs constituting the first current source 20a and the second current source 20b.

That is, the first current source 20a and the second current source 20b constitute a current mirror circuit, and the ratio between the current $I_{REP}$ and the current $I_{TOTAL}$ is "1:a".

The reference voltage VREF is set to the voltage of the first internal node when the first switch 16a is in an ON state or the voltage of the second internal node when the second switch 16b is in an ON state. That is, the reference voltage VREF is set to a voltage equal to the high voltage of the differential output signal.

Further, for example, when the differential output buffer 10 is mounted on a semiconductor chip, the first switch 16a, the second switch 16b and the third switch 16c, the first internal resistor 18a, the second internal resistor 18b and the third internal resistor 18c, the first current source 20a and the second current source 20b, and the operational amplifier 26 are mounted on the semiconductor chip, while the first external capacitor 22a and the second external capacitor 22b, and the first external resistor 24a, the second external resistor 24b and the third external resistor 24c are disposed outside the semiconductor chip.

Next, the operation of the differential output buffer 10 will be described.

Here, the currents flowing through the first internal resistor 18a, the second internal resistor 18b, the third internal resistor 18c and the third external resistor 24c are respectively represented by $I_A$, $I_B$, $I_C$ and $I_D$, and voltages of the first internal node, the second internal node and the third internal node are respectively represented by $V_A$, $V_B$ and $V_{A\_REP}$. Further, a voltage of a fourth internal node between the first switch 16a and the first current source 20a is represented by $V_C$, and a voltage of a fifth internal node between the third switch 16c and the second current source 20b is represented by $V_{C\_REP}$.

When a high voltage and a low voltage are respectively input as the differential input signal to the gate of the NMOS of the first switch 16a and the gate of the NMOS of the second switch 16b as illustrated in FIG. 1, the first switch 16a is in an ON state and the second switch 16b is in an OFF state in the differential output circuit 12.

In this case, the current $I_A$ flows from the high voltage power supply through the first internal resistor 18a while the current $I_B$ flows from the high voltage power supply through the second internal resistor 18b, the second external capacitor 22b, the second external resistor 24b, the first external resistor 24a and the first external capacitor 22a, and the current $I_{TOTAL}$ that is a sum of the two currents flows to the low voltage power supply through the first switch 16a and the first current source 20a. As a result, the differential output signal with the first internal node at a low voltage and the second internal node at a high voltage is output.

In the bias voltage generation circuit 14, since a high voltage is input to the gate of the NMOS of the third switch 16c, the third switch 16c is in an ON state.

In this case, the current $I_C$ flows from the high voltage power supply through the third internal resistor 18c while the current $I_D$ flows from the high voltage power supply through the third external resistor 24c, and the current $I_{REP}$ that is a sum of the two currents flows to the low voltage power supply through the third switch 16c and the second current source 20b.

Here, the voltage $V_A$ of the first internal node is a value that can be calculated from the differential amplitude of the differential output signal. Therefore, the reference voltage VREF is controlled to be a voltage equal to the voltage $V_A$ of the first internal node, and using the operational amplifier 26, the current $I_{REP}$ flowing through the second current source 20b is controlled by the bias voltage VBIAS such that the voltage $V_{A\_REP}$ of the third internal node becomes equal to the reference voltage VREF. Consequently, the voltage $V_{A\_REP}$ of the third internal node becomes a voltage equal to the reference voltage VREF, that is, the voltage $V_A$ of the first internal node.

Since the voltage drop (Drop) caused by the first switch 16a and that by the third switch 16c are equal to each other, the voltage $V_C$ of the fourth internal node between the first and second switches 16a and 16b and the first current source 20a ultimately becomes equal to the voltage $V_{C\_REP}$ of the fifth internal node between the third switch 16c and the second current source 20b. That is, it is possible to eliminate a current error caused by the difference in the source-drain voltage $V_{DS}$ between the NMOS of the second current source 20b that is the mirror source of the current mirror circuit and the NMOS of the first current source 20a that is the mirror destination thereof.

Further, the current $I_{REP}$ is calculated using Equation (9).

$$I_{REP} = \frac{V_A}{(1.5 \cdot a \cdot R_{EXT} // 1.5 \cdot a \cdot R_{INT})} = \frac{R_{INT} + R_{EXT}}{1.5 \cdot a \cdot (R_{INT} \cdot R_{EXT})} \cdot V_A \quad \text{Equation (9)}$$

The relationship between the current $I_{TOTAL}$ and the current $I_{REP}$ is expressed by Equation (10).

$$I_{TOTAL} = a \cdot I_{REP} \quad \text{Equation (10)}$$

The differential amplitude $V_A - V_B$ is expressed by Equation (11) by assigning Equations (9) and (10) to Equation (6).

$$V_A - V_B = \tfrac{2}{3} V_A \quad \text{Equation (11)}$$

Since the reference voltage VREF=voltage $V_A$, Equation (11) is expressed by Equation (12).

[Math. 10]

$$V_A - V_B = \tfrac{2}{3} V_{REF} \quad \text{Equation (12)}$$

That is, in the differential output buffer 10 of this embodiment, the terms of the resistance value $R_{INT}$ of the first internal resistor 18a and the second internal resistor 18b and the resistance value $R_{EXT}$ of the first external resistor 24a and the second external resistor 24b are deleted from the equation for the differential amplitude $V_A - V_B$, and only the term of the differential output voltage $V_A$ is left. Therefore, the differential amplitude $V_A - V_B$ can be determined by the reference voltage VREF, regardless of the resistance value $R_{INT}$ of the first internal resistor 18a and the second internal resistor 18b.

For example, the current $I_{TOTAL}$ is assumed to be 8 mA. If the resistance value $R_{EXT}$ of each of the first external resistor 24a and the second external resistor 24b is 50Ω (the combined resistance value of the two resistors is 100Ω) and the resistance value $R_{INT}$ of each of the first internal resistor 18a and the second internal resistor 18b is 50Ω, when these values are assigned to Equation (6), the differential amplitude $V_A - V_B$ is 200 mV.

In the conventional differential output buffer 30, if the resistance value $R_{INT}$ of the first internal resistor 18a and the second internal resistor 18b is assumed to increase by 10% due to the variation, the resistance value $R_{INT}$ is 55Ω. In this case, the differential amplitude $V_A - V_B$ is 209.5 mV, and an error occurs.

In contrast, in the differential output buffer 10 of this embodiment, the voltage $V_A$ is calculated to be 300 mV from Equation (4). That is, the reference voltage VREF supplied from the reference voltage generation circuit 28 is 300 mV.

In the differential output buffer 10 of this embodiment, since the value of the differential amplitude $V_A - V_B$ is determined only with the value of the reference voltage VREF, when VREF=300 mV is applied to Equation (12), the differential amplitude $V_A - V_B$ is 200 mV, and this differential amplitude does not depend on the variation in the resistance value $R_{INT}$ of the first internal resistor 18a and the second internal resistor 18b.

Figure 2:
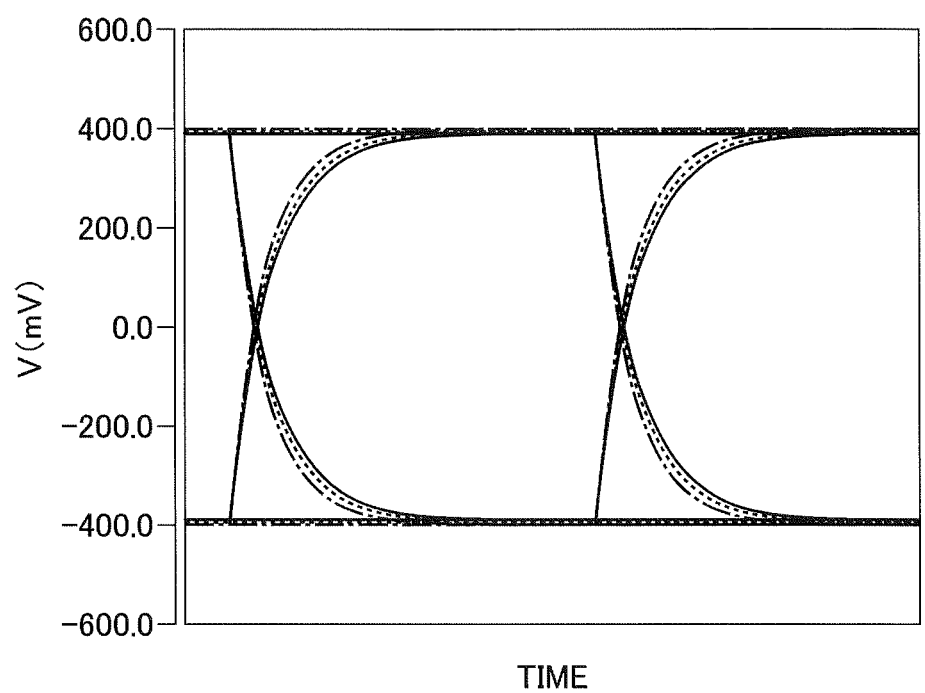
FIG. 2 is an exemplary eye diagram illustrating differential amplitude $V_A$-$V_B$ of the differential output buffer illustrated in FIG. 1.
Figure 3:
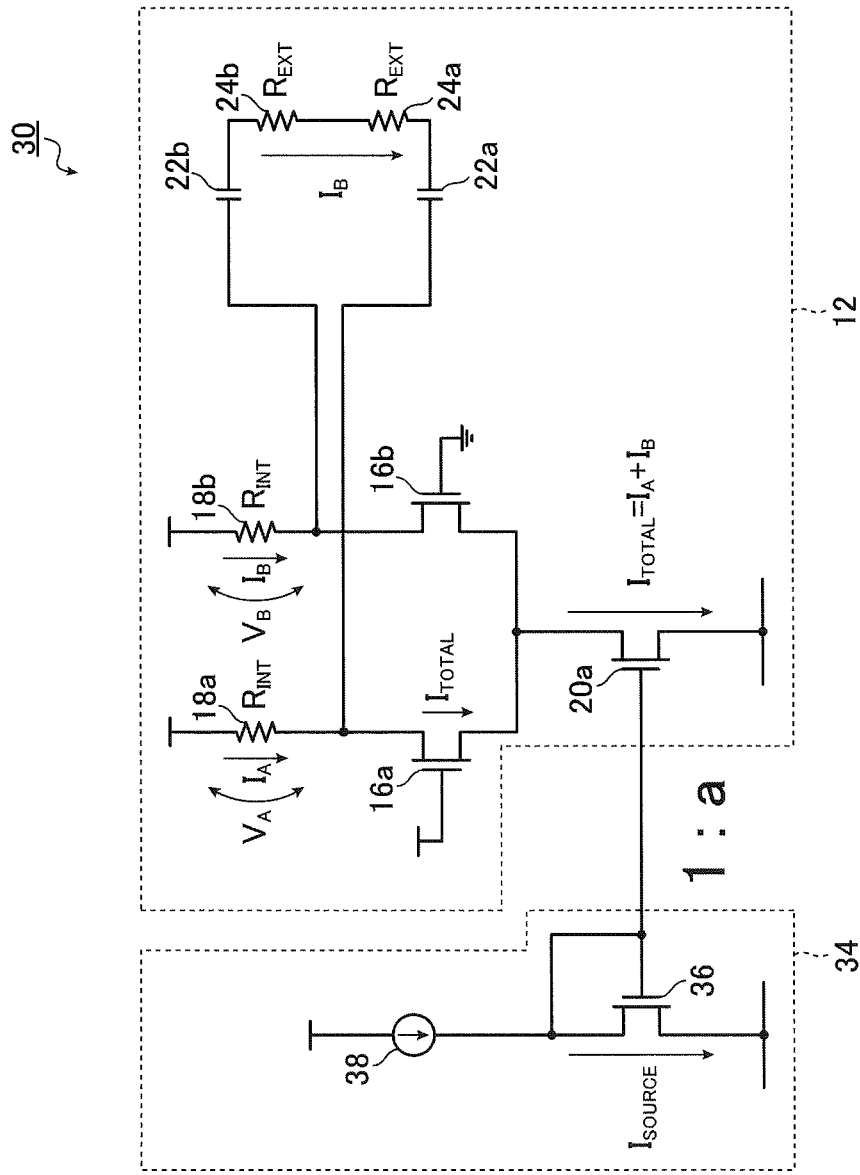
FIG. 3 is an exemplary circuit diagram illustrating a configuration of a conventional differential output buffer.
Figure 4:
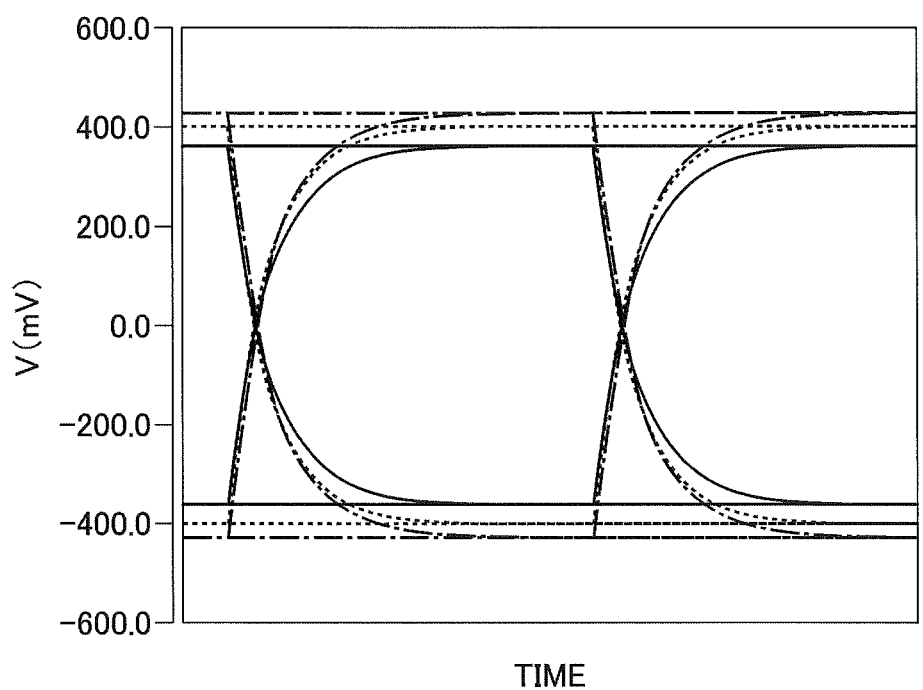
FIG. 4 is an exemplary eye diagram illustrating differential amplitude $V_A$-$V_B$ of the differential output buffer illustrated in FIG. 3.

FIG. 2 is an exemplary eye diagram illustrating the differential amplitude $V_A - V_B$ of the differential output buffer illustrated in FIG. 1. As with FIG. 4, the vertical axis of the eye diagram illustrated in FIG. 2 indicates voltage V (mV), and the horizontal axis indicates time. This eye diagram is for the case in which it is assumed that the resistance value $R_{INT}$ has a variation of ±20% due to a variation in a process. The solid line indicates the case in which there is a variation of −20%, the dashed line indicates the case in which there is no variation, and the long dashed short dashed line indicates the case in which there is a variation of +20%. As shown in this eye diagram, it can be seen that in the differential output, buffer 10 of this embodiment, even when the resistance value $R_{INT}$ varies, the differential amplitude $V_A - V_B$ hardly varies.

In the case in which the resistance values of the third internal resistor 18c and the third external resistor 24c are respectively not resistance values that are "X·a" times the resistance value $R_{INT}$ of the first and second internal resistors 18a and 18b and "X·a" times the resistance value $R_{EXT}$ of the first and second external resistors 24a and 24b, the terms of the resistance value $R_{INT}$ and the resistance value $R_{EXT}$ are not completely deleted from the equation for the differential amplitude $V_A - V_B$. However, even in this case, it is possible to reduce the variation in the differential amplitude $V_A - V_B$ as compared to the conventional differential output buffer.

The present invention is basically as described above.

Hereinbefore, the present invention has been described in detail, but the present invention is not limited to the above-described embodiment. Needless to say, the present invention may be improved or modified in various ways within a scope that does not depart from the gist of the present invention.

What is claimed is:

1. A differential output buffer comprising a differential output circuit, and a bias voltage generation circuit that generates a bias voltage for controlling a current flowing in the differential output circuit,
   wherein the differential output circuit includes:
   a first switch and a second switch, one of the first switch and the second switch being in an ON state and another thereof being in an OFF state according to a differential input signal;
   a first internal resistor and a second internal resistor which are connected between a high voltage power supply and the first switch and between the high voltage power supply and the second switch, respectively, and have a same resistance value;
   a first current source which is connected between the first and second switches and a low voltage power supply, and passes a current having a fixed value according to the bias voltage; and
   a first external resistor and a second external resistor which are connected in series between a first internal node and a second internal node, and have a same resistance value, the first internal node being located between the first internal resistor and the first switch, and the second internal node being located between the second internal resistor and the second switch, and
   the bias voltage generation circuit includes:
   a third switch equivalent to the first switch or the second switch in an ON state;

a third internal resistor which is connected between the high voltage power supply and the third switch, and is equivalent to the first internal resistor or the second internal resistor;

a second current source which is connected between the third switch and the low voltage power supply, and is equivalent to the first current source;

a third external resistor which is connected between the high voltage power supply and the third switch in parallel to the third internal resistor, and is equivalent to the first external resistor or the second external resistor; and an operational amplifier that generates the bias voltage for controlling currents respectively flowing in the first current source and the second current source such that a voltage of a third internal node, which is equivalent to the first internal node or the second internal node, and is between the third internal and external resistors and the third switch becomes equal to a reference voltage equal to a voltage of the first internal node when the first switch is in an ON state or equal to a voltage of the second internal node when the second switch is in an ON state.

2. The differential output buffer according to claim 1, wherein when each of the resistance values of the first internal resistor and the second internal resistor is $R_{INT}$, and each of the resistance values of the first external resistor and the second external resistor is $R_{EXT}$, the third internal resistor and the third external resistor respectively have a resistance value of "X" times the resistance value $R_{INT}$ and a resistance value of "X" times the resistance value $R_{EXT}$, where "X" is calculated by Equation (13).

$$X = \frac{R_{INT} + 2R_{EXT}}{2R_{INT} + 2R_{EXT}}\left(1 + \frac{R_{INT}}{R_{EXT}}\right) \quad \text{Equation (13)}$$

3. The differential output buffer according to claim 2, wherein the third switch is configured with the first switch or the second switch, and the second current source is configured with a transistor having a size of "1/a" times a size of the first current source ("a" is a positive real number other than zero), and the third internal resistor has a resistance value of "X·a" times the resistance value $R_{INT}$, and the third external resistor has a resistance value of "X·a" times the resistance value $R_{EXT}$.

4. The differential output buffer according to claim 3, wherein a first external capacitor and a second external capacitor have a same capacitance value, the first external capacitor is connected between the first internal resistor and the first external resistor, and the second external capacitor is connected between the second internal resistor and the second external resistor, respectively.

5. The differential output buffer according to claim 2, wherein a first external capacitor and a second external capacitor have a same capacitance value, the first external capacitor is connected between the first internal resistor and the first external resistor, and the second external capacitor is connected between the second internal resistor and the second external resistor, respectively.

6. The differential output buffer according to claim 1, wherein a first external capacitor and a second external capacitor have a same capacitance value, the first external capacitor is connected between the first internal resistor and the first external resistor, and the second external capacitor is connected between the second internal resistor and the second external resistor, respectively.

7. The differential output buffer according to claim 1, wherein each of the first internal resistor, the second internal resistor, and the third internal resistor is configured with a polysilicon resistance.

8. The differential output buffer according to claim 1, wherein each of the first internal resistor, the second internal resistor, and the third internal resistor is configured with an on-resistance of a MOS transistor in an ON state.

* * * * *